United States Patent
Walkup et al.

(10) Patent No.: US 6,203,350 B1
(45) Date of Patent: Mar. 20, 2001

(54) ZIF SOCKET

(75) Inventors: William B. Walkup, Hillsboro, OR (US); Wen-Chun Pei, Taipei (TW)

(73) Assignee: Hon Hai Precision Inc. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/439,117

(22) Filed: Nov. 12, 1999

(51) Int. Cl.⁷ ................................................ H01R 13/625
(52) U.S. Cl. ............................................................ 439/342
(58) Field of Search ............................ 439/342, 259–270

(56) References Cited

U.S. PATENT DOCUMENTS

| | | | | |
|---|---|---|---|---|
| 4,420,205 | * | 12/1983 | Kirkman | 439/342 |
| 4,538,870 | * | 9/1985 | Thewlis | 439/342 |
| 5,649,836 | * | 7/1997 | Kashiwagi | 439/342 |
| 5,658,160 | * | 8/1997 | Kashiwagi | 439/342 |
| 5,707,247 | * | 1/1998 | Konstad | 439/342 |
| 5,730,615 | * | 3/1998 | Lai et al. | 439/342 |
| 5,855,489 | * | 1/1999 | Walker | 439/342 |

* cited by examiner

Primary Examiner—Gary F. Paumen
(74) Attorney, Agent, or Firm—Wei Te Chung

(57) ABSTRACT

A socket comprises a cover movably mounted on a base between an open status and a closed status. The cover and the base each have a body portion and a head portion extending from the body portion. The cover has first pair of inner walls and second pair of inner walls respectively formed in the body portion and the head portion thereof for slidably retaining the corresponding body portion and head portion of the base. Positioning members containing spaced shallow regions are formed in the body portion and the head portion of the base for receiving protrusions formed in the corresponding body portion and head portion of the cover so that the cover can be retained in either the open status or closed status by cooperation of the positioning members and the protrusions.

1 Claim, 9 Drawing Sheets

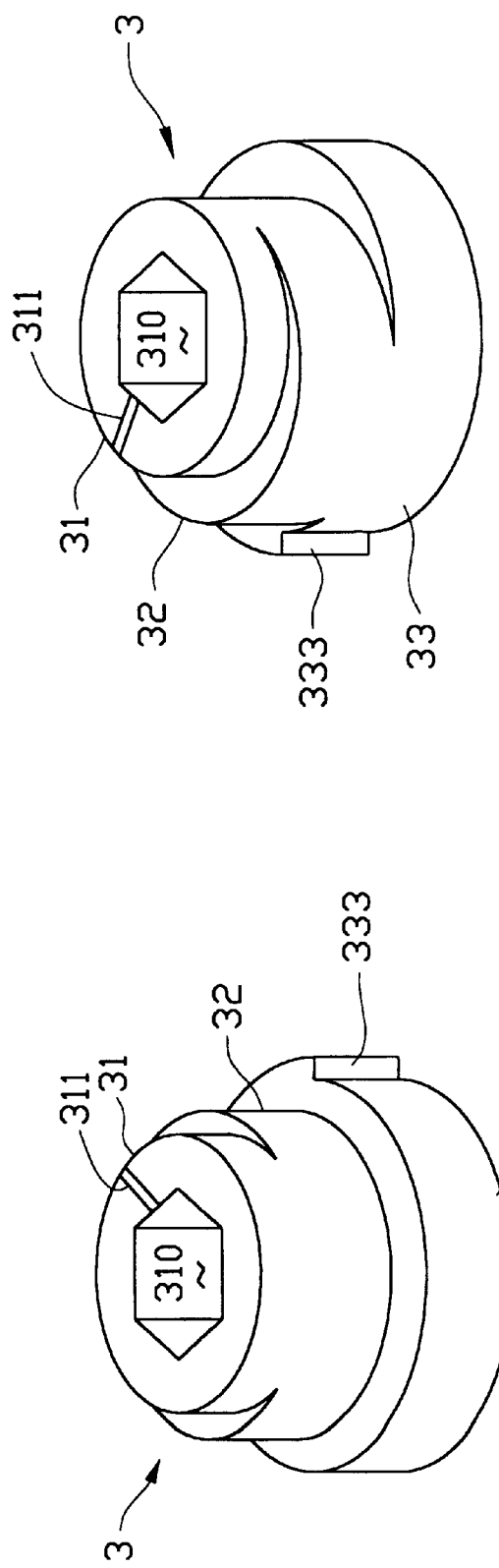
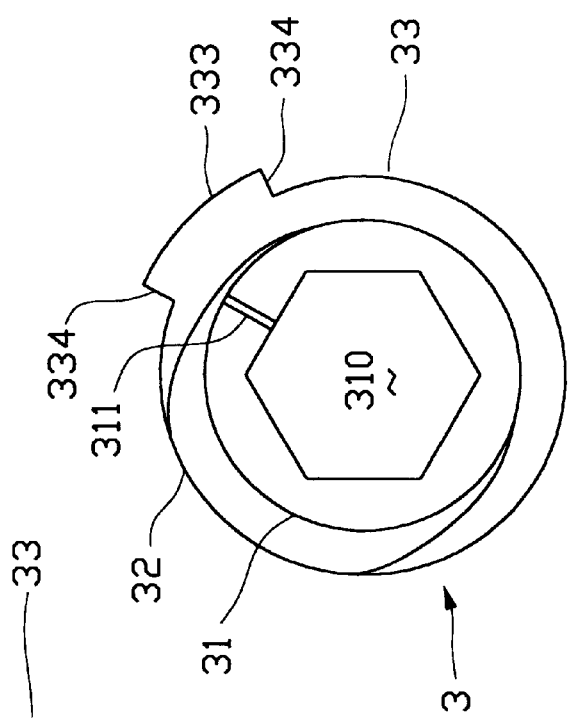

ZIF SOCKET

BACKGROUND OF THE INVENTION

1. Field of the Invention

The present invention relates to a zero insertion force (ZIF) socket, and especially to a ZIF socket having a single-point driving mechanism which drives a cover of the socket to move smoothly with respect to a base thereof in opposite directions from one driving point thus rendering the socket in either a closed status or an open status.

2. The Prior Art

Conventional zero insertion force (ZIF) sockets normally comprise a cover defining a plurality of upper passageways therein and slidably engaging with a base having a corresponding number of lower passageways retaining contacts therein. The upper passageways and the lower passageways are in constant communication with each other when the cover is moved with respect to the base. A cam is received in a space defined between the cover and the base and operative to move the cover with respect to the base thereby positioning the socket at either an open status ready for insertion of pins of a CPU package or a closed status forcing the pins of the CPU package to abut against the corresponding contacts. When the socket is in the open status, the pins of the CPU package are inserted into the upper passageways and the lower passageways with a substantially zero insertion force, but are not in electrical contact with the contacts retained in the lower passageways. The cam is then operated to drive the cover to move laterally relating to the base thereby urging the pins of the CPU package to electrically connect with the contacts of the base. U.S. Pat. No. 5,730,615 which belongs to the same assignee of this application has disclosed a socket having a cover movably engaged with a base and positioning means including a vertical protrusion on the side face of the base to cooperate with a pair of spaced shallow regions, named front shallow region and rear shallow region, formed in the interior portion of the cover. Therefore, the protrusion of the base may be received within the front shallow region in the cover when the socket is in an open status, and within the rear shallow region when the socket is in a closed status. However, the vertical protrusion on the side face of the base is apt to be worn out due to repeated friction with the inner wall of the shallow regions. If one of the vertical protrusions is worn out, the left one will cause an imbalance thus hindering the normal movement of the cover.

Moreover, a driving mechanism as disclosed in the prior art for driving the cover to move with respect to the base utilizes a screwdriver inserted into slots defined in the cover and the base to drive the cover. Since the slots are defined in expansion sections respectively extended from center portions of front sides of the base and the cover, the driving point is relatively small compared to the front side of the cover. With this structure, the driving force from the screwdriver is not guaranteed evenly distributed in two sides of the cover which may cause the cover to move not smoothly on the base. Additionally, when the user pivots the screwdriver he (she) needs a considerable space for operation and may be prohibited by peripheral components nearby thus causing difficulty.

It is requisite to provide a new socket to solve the above problems.

SUMMARY OF THE INVENTION

The primary purpose of the present invention is to provide an improved ZIF socket having a cover movably mounted on a base which has an even-force distribution structure for guaranteeing a cover to move smoothly on a base.

Another purpose of the present invention is to provide an improved ZIF socket having a driving cam simultaneously received in a base and a cover allowing a user to operate thereon with little space.

In accordance with one aspect of the present invention, a socket is provided to comprise a base and a cover movably mounted on the base. The base has a first body portion and a first head portion extending from the first body portion. The first body portion has a pair of wide spaced sides parallel to an axis of the base. The first head portion has a pair of narrow spaced sides parallel to the same axis of the base. At least one positioning member is formed in each pair of the wide spaced sides and the narrow spaced sides. The at least one positioning member has two shallow regions spaced by a rib. The cover has a second body portion and a second head portion extending from the second body portion. The second body portion has a pair of wide spaced inner walls movably receiving the pair of wide spaced sides of the base therebetween. The second head portion has a pair of narrow spaced inner walls movably receiving the narrow spaced sides of the base therebetween. At least one protrusion extends from each pair of the wide spaced inner walls and the narrow spaced inner walls for being positioned in one of the two shallow regions of the at least one positioning member of the base.

In accordance with another aspect of the present invention, a socket comprises a base, a cover movably mounted on the base, and a driving cam rotatably received in the base and the cover. The base has a first body portion and a first head portion extending from the first body portion along an axis thereof. A first reception space is formed in the first head portion and comprises two inner stop walls spaced from each other. At least one positioning member is formed in each of the first body portion and the first head portion, wherein the at least one position member comprises two shallow regions spaced by a rib. The cover has a second body portion and a second head portion extending from the second body portion. A second reception space is formed in the second head portion. At least one protrusion is formed in each of the second body portion and the second head portion, wherein the at least one protrusion is selectively positioned in one of the two shallow regions of the at least one positioning member of the base. The driving cam has a lower portion rotatably retained in the first reception space and rotatable between the two inner stop walls of the first reception space and an upper portion retained in the second reception space of the cover and rotatable to drive inner periphery portion of the cover thus moving the cover to move along the axis of the base.

BRIEF DESCRIPTION OF THE DRAWINGS

FIG. 4A is perspective view of a driving cam used in the present invention;

FIG. 4B is perspective view of the driving cam of FIG. 3A taken from a different angle;

FIG. 4C is a top plan view of the driving cam;

DETAILED DESCRIPTION OF THE PREFERRED EMBODIMENT

Figure 1:
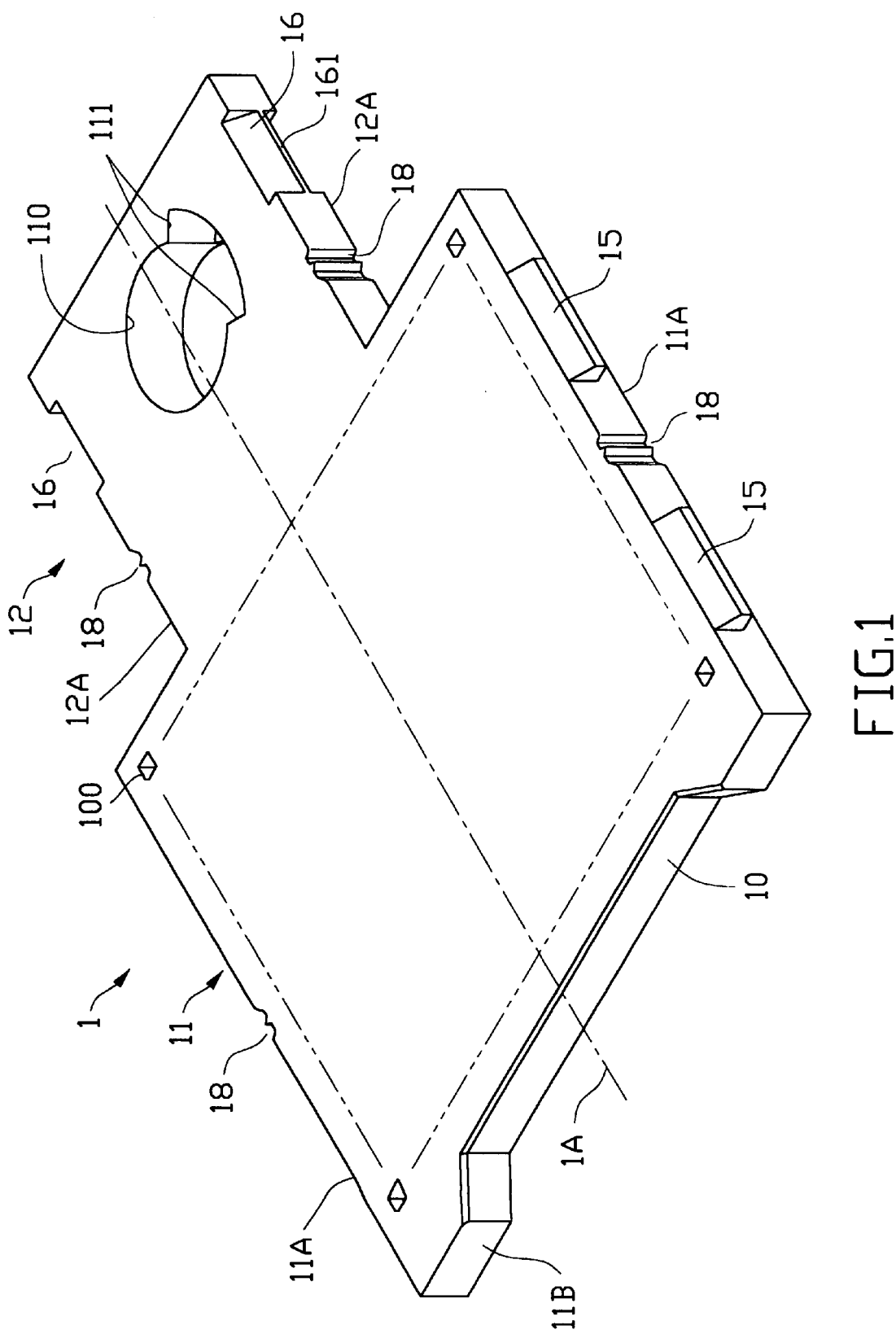
FIG. 1 is a perspective view of a base of a ZIF socket connector in accordance with the present invention.
Figure 3:
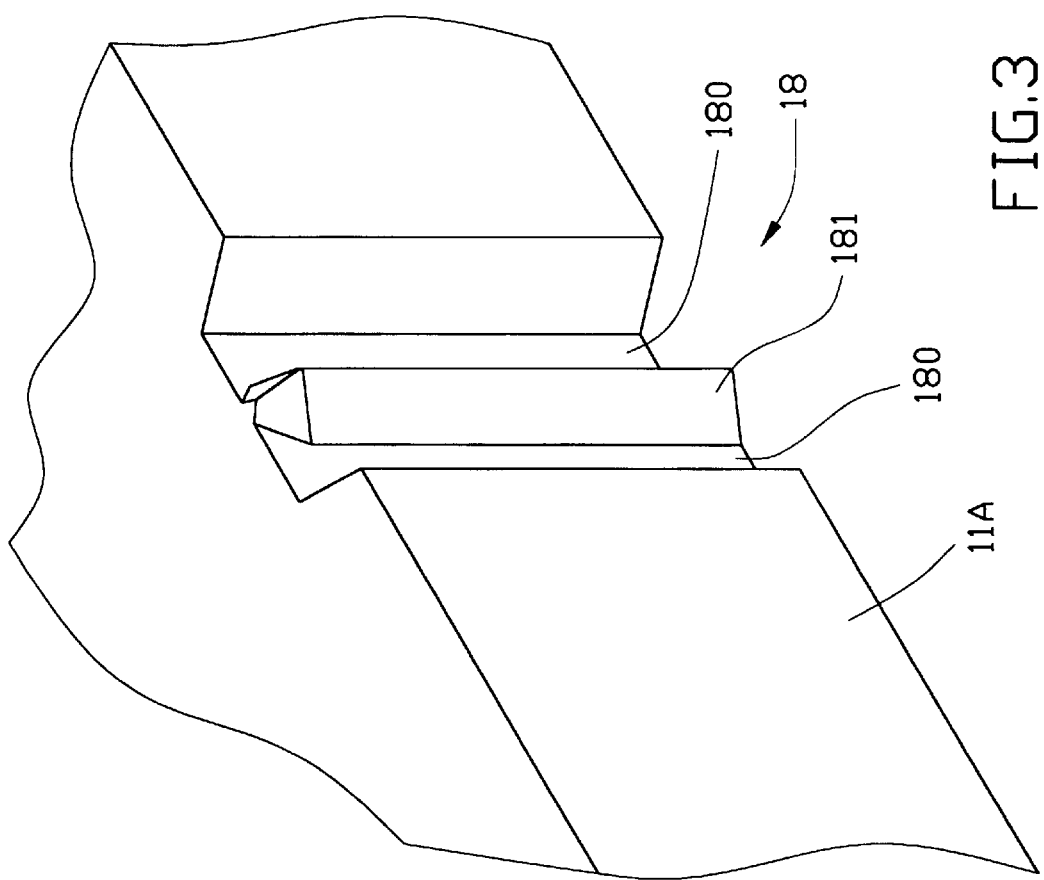
FIG. 3 is an enlarged view of a positioning member of the base.

Referring to FIG. 1, a base 1 of a socket in accordance with the present invention comprises a housing 11 and a head 12 extending from the housing 11. The housing 11 has two sliders 15 formed in opposite parallel sides 11A thereof and defines a plurality of passage ways 100 receiving contacts (not shown) therein for electrically and mechanically connecting to CPU pins (not shown) inserted thereinto. The head 12 defines a groove 16 in opposite parallel sides 12A thereof and a rib 161 extending from each groove 16. The parallel sides 11A of the head 12 and the parallel sides 12A of the housing 12 are substantially parallel to a longitudinal axis 1A of the base 1. A pair of positioning members 18 are formed in the parallel sides 12A of the head 12. Similarly, another pair of positioning members 18 are formed in the parallel sides 11A of the housing 11. Also referring to FIG. 3, each positioning member 18 comprises two grooves 180 formed in the side wall 11A (or 12A) and spaced by a triangular rib 181. A rear cutout 10 is defined in a rear side 11B of the housing 11. A reception cavity 110 is defined in the head 12, with two inner stop walls 111 formed in an innerperiphery thereof. The inner stop walls 111 are substantially in the same side with respect to the longitudinal axis 1A.

Figure 2:
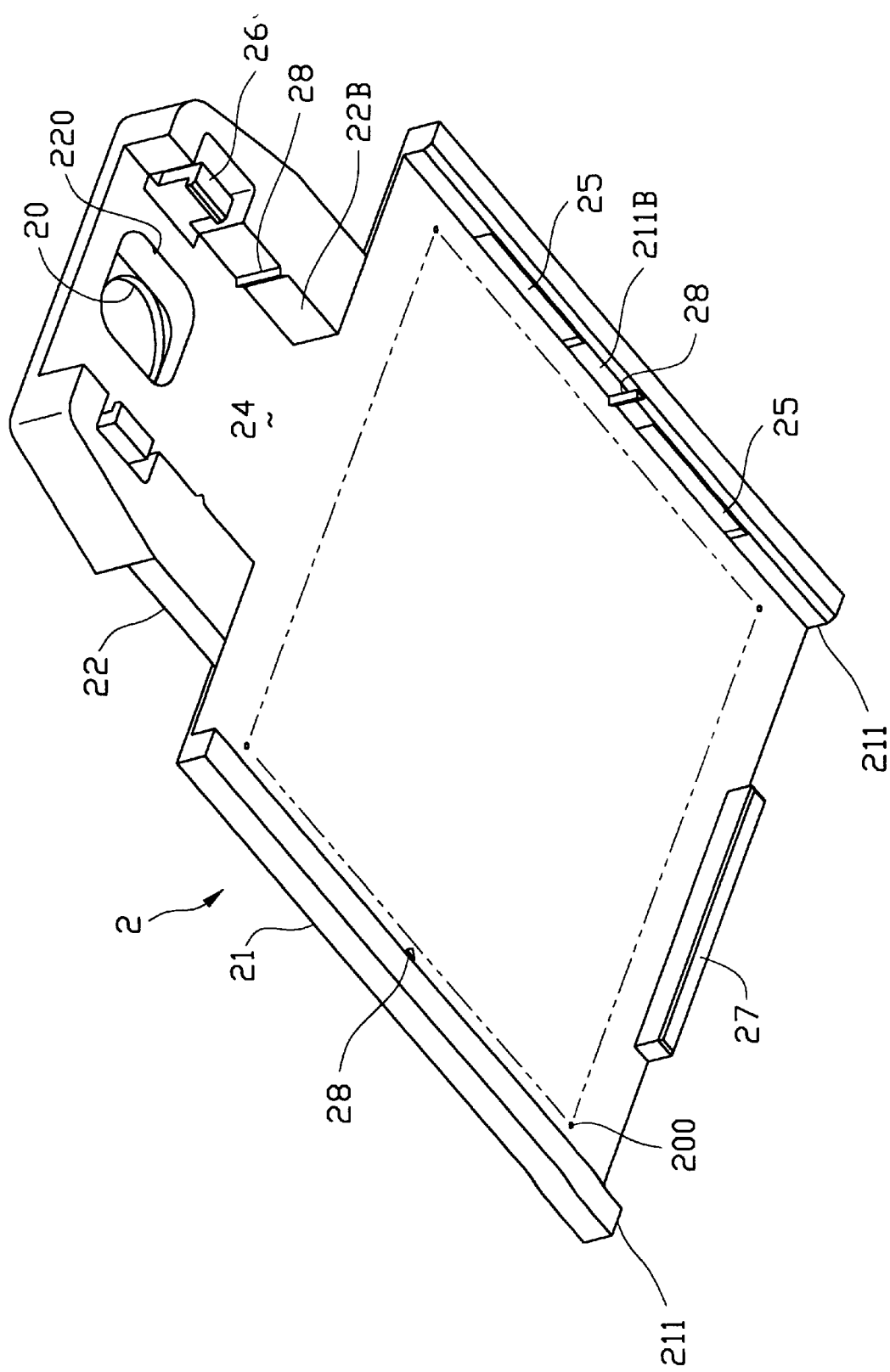
FIG. 2 is a perspective view of a cover of the connector in accordance with the present invention.

Referring to FIG. 2, a cover 2 adapted to be slidably engaged with the base 1 comprises a body portion 21 and a head 22 extending from the body portion 21. The head 22 has parallel inner walls 22B thereby defining a space 24 therebetween for movably receiving the head 12 of the base 1 therein. The body portion 21 has a plurality of conic holes 200 formed therein for receiving CPU pins (not shown) and each conic hole 200 is maintained in constant communication with a corresponding passageway 100 of the base 1 when the cover 2 is assembled to and moved on the base 1. Two guiding arms 211 extend from parallel opposite sides of the body portion 21 and each guiding arm 211 has two guiding recesses 25 formed in an inner wall 211B thereof for slidably receiving the sliders 15 of the base 1 when the cover 2 is assembled to the base 1. The inner surfaces 211B of the guiding arms 211 are parallel to each other. A pair of triangular ribs 28 having substantially identical shape with the triangular rib 181 of the base 1 are formed in the inner walls 22B of the head 22. Similarly, another pair of triangular ribs 28 are formed in the inner surfaces 211B of the housing 21. A stopping bar 27 extends from a bottom surface of the body portion 21 substantially in alignment with rear side thereof for being received in the rear cutout 10 of the base 1 for limiting the moving distance of the cover 2 with respect to the base 1. The stopping bar 27 together with the guiding arms 211 also constitute reinforcing means preventing the cover 2 from warpage during movement thereof. The head 22 of the cover 2 has two resilient clamps 26 extending downward for slidably engaging with the ribs 161 of the base 1 when the cover 2 is assembled to the base 1. An upper opening 20 and a lower opening 220 are defined in the head 22 and communicated with each other. The upper opening 20 has an elliptic-like shape and the lower opening 220 has a rectangular-like shape.

Referring to FIGS. 4A to 4C, a driving cam 3 comprises an upper circular portion 31 connected to a middle cam portion 32 connected to a lower circular portion 33. A tool reception hole 310, herein a hexagonal hole, is defined through the driving cam 3 allowing an external tool (not shown), such as a hexagonal wrench to operate therewith for rotate the driving cam 3. An indication groove or mark 311 is defined along a radial direction around the tool reception hole 310 for indicating the rotated angle of the driving cam 3. The tool reception hole 310 may be alternatively formed as a slit or a cross shape allowing other screwdrivers to operate therewith. The lower circular portion 33 has an arcuate protrusion 333 extending from a periphery thereof with two abutment faces 334 on two sides of the protrusion 333.

Figure 5:
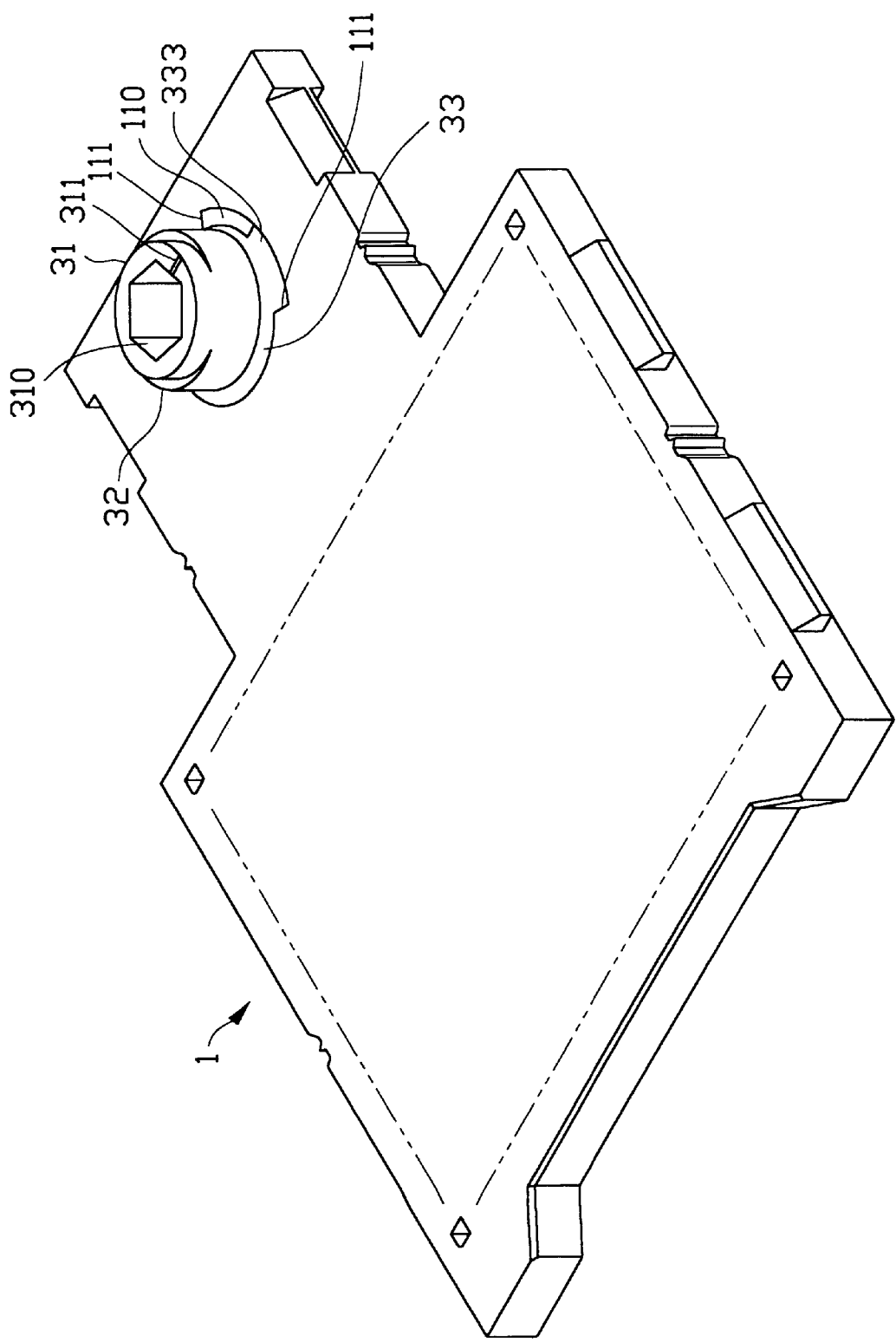
FIG. 5 is a perspective view showing the driving cam is installed in the base.

Referring to FIG. 5, the lower circular portion 33 of the driving cam 3 is assembled into reception cavity 110 of the base 1, with the upper circular portion 31 and the middle cam portion 32 remaining out of the reception cavity 110, wherein the lower circular portion 33 is rotatable within substantially a 90-degree range in the reception cavity 110 and the arcuate protrusion 333 is blocked by either of the inner stop walls 111 when it is rotated to one of two extremes of the 90-degree range. FIG. 5 particularly shows that the lower circular portion 33 is rotated to an extreme of the 90-degree range, wherein the arcuate protrusion 333 is stopped by one of the inner stop walls 111 of the reception cavity 110 of the base 1.

Figure 9:
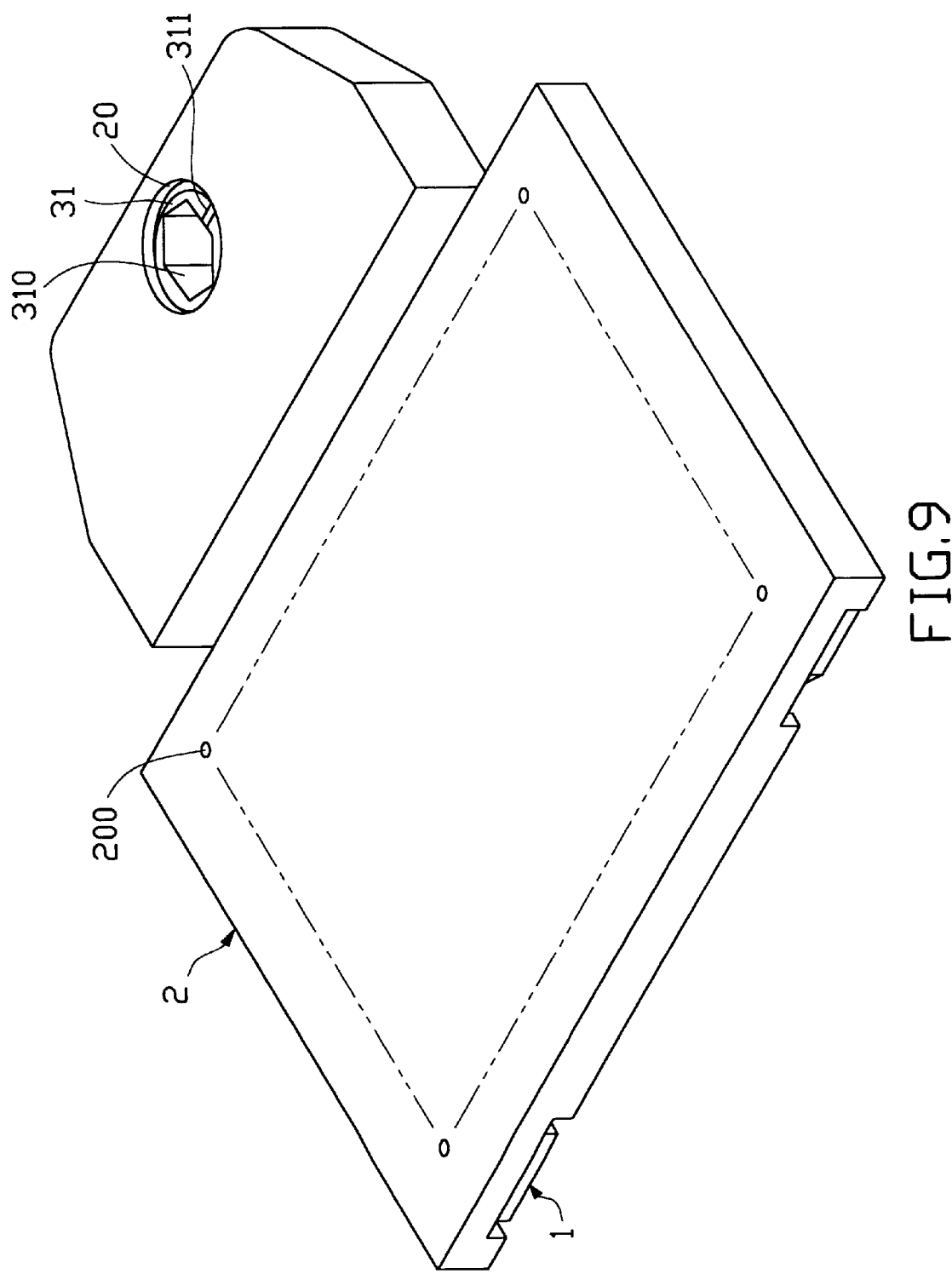
FIG. 9 is an assembled view of the socket in accordance with the present invention.

Referring to FIG. 9, after the driving cam 3 is assembled into the reception cavity 110 of the base 1, the cover 2 may be assembled on the base 1, with the upper circular portion 31 and the middle cam portion 32 of the driving cam 3 respectively received in the upper opening 20 and the lower opening 220 and the tool reception hole 310 exposing to external allowing an external tool (not shown) to rotate the driving cam 3 therewith. When the cover 2 is driven by the driving cam 3 to move on the base 1, the upper opening 20 due to the elliptic-like shape thereof can be maintained straight by the upper circular portion 31 retained therein thereby guaranteeing the cover 2 to move straight along a longitudinal axis thereof without deflection. Moreover, the cover 2 may be smoothly moved on the base 1 because the head 22 and the body portion 21 thereof respectively movably retain the head 12 and the housing 11 of the base 1 and the driving cam 3 is located in the heads 12, 22 of the base 1 and the cover 2. Specifically, the driving cam 3 can evenly move the two inner walls 22B and the guiding arms 211 of the cover 2 from inner periphery of the lower opening 220 because the lower opening 220 is substantially formed in the axis of the head 22.

Figure 6B:
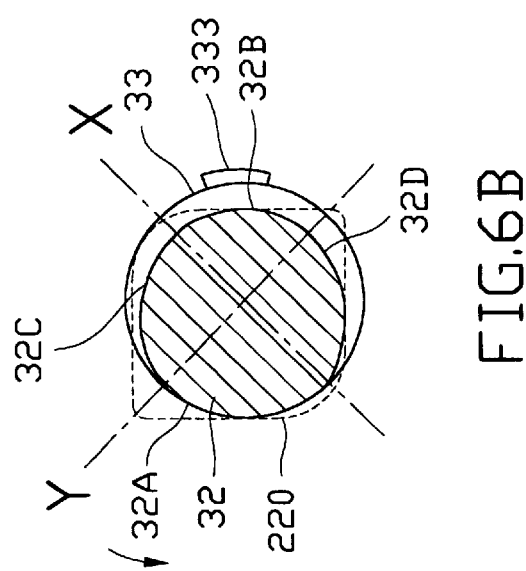
FIGS. 6A to 6C are operational schematic views of the driving cam with respect to the cover.
Figure 6A:
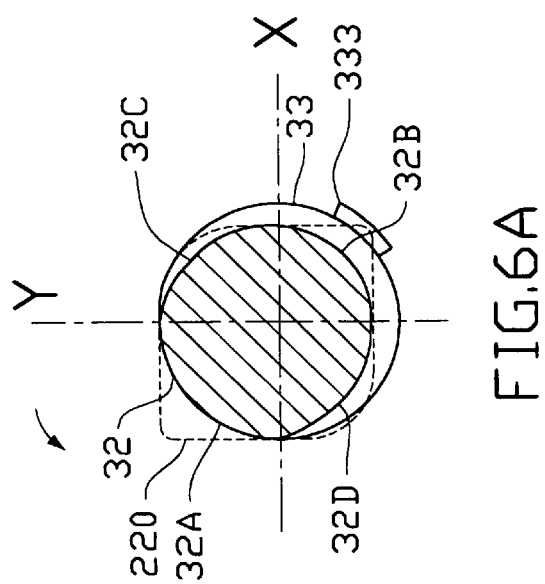
Figure 6C:
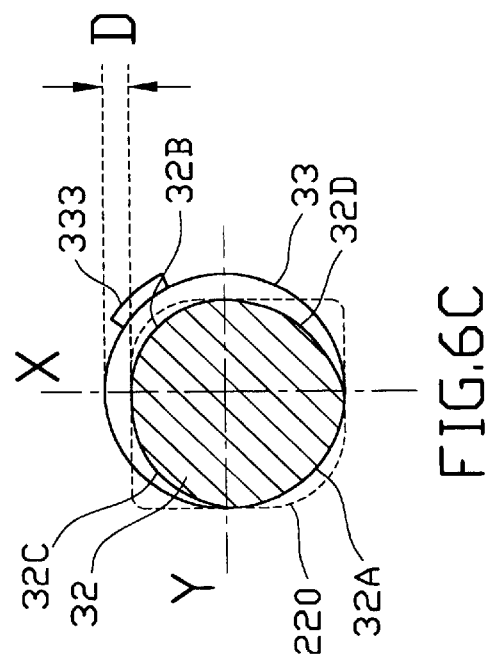

Referring to FIGS. 6A to 6C, an operational relation between the middle cam portion 32 and the cover 2 (herein schematically represented by the lower opening 220 shown by phantom line) is illustrated, wherein two axes X and Y are used to indicate the rotation of the middle cam portion 32. From the sequence of FIGS. 6A to 6C, the middle cam portion 32 together with the lower circular portion 33 and the upper circular portion 31 (not shown herein but can be referred to FIG. 5) are rotated clockwise for substantially 90 degrees, thereby rendering the cover 2 to move along a first direction for a distance D. Similarly, the middle cam portion 32 can be rotated counter clockwise from a reverse sequence thereby rendering the cover 2 to move along a second direction opposite to the first direction for the same distance D.

Figure 7:
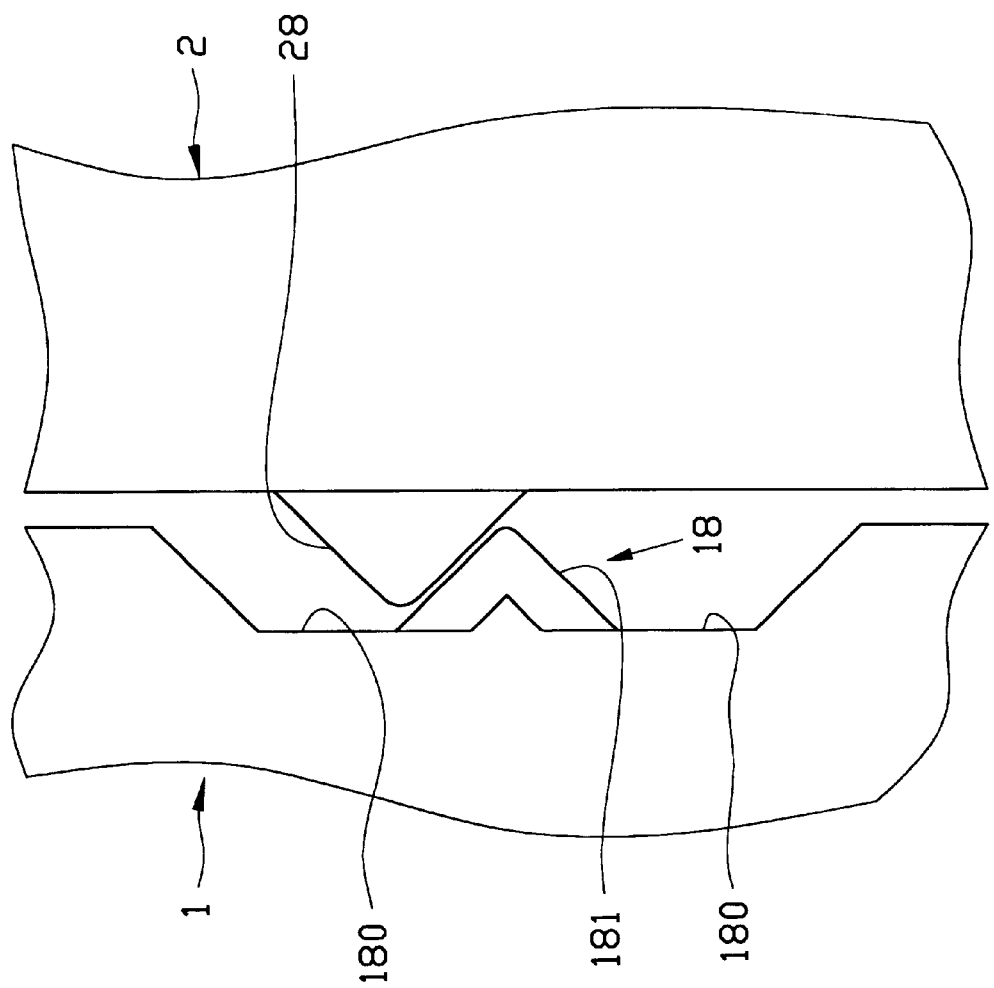
FIG. 7 is an enlarged schematic view of a positioning pair showing an open status between the cover and the base of the socket.
Figure 8:
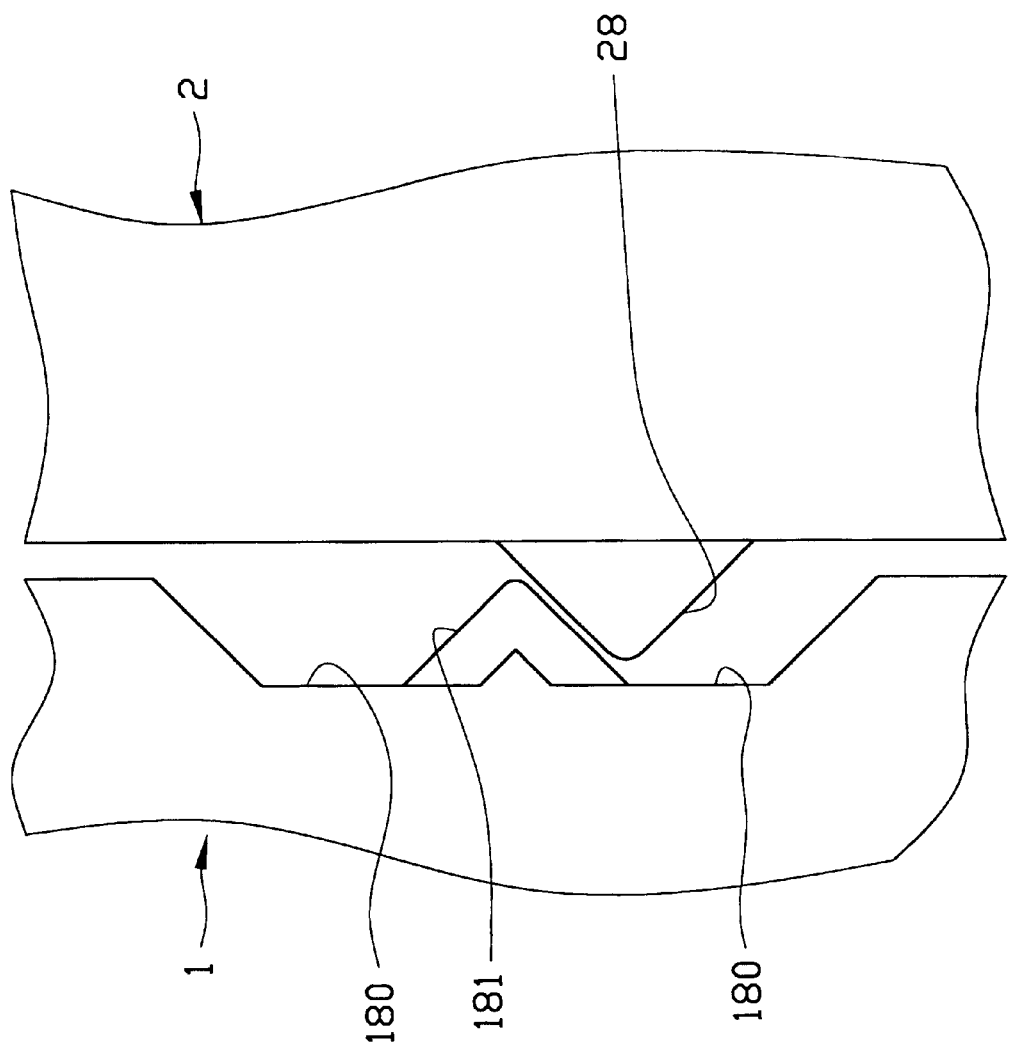
FIG. 8 is an enlarged schematic view of the positioning pair showing an closed status between the cover and the base of the socket.

Referring to FIG. 7, the triangular rib 28 of the cover 2 is retained in one of the grooves 180 of the positioning member 18 when the cover 2 is remained in the open status. When the driving cam 3 is rotated in a first direction, the cover 2 is moved so that the rib 28 of the cover 2 is forced to slide over the rib 181 of the positioning member 18 of the base 1 and rest in the other groove 180 of the same positioning member 18 as shown in FIG. 8. Similarly, the rib 28 of the cover 2 may be moved back to the original groove 180 as shown in FIG. 7, if the driving cam 3 is rotated in opposite direction.

While the present invention has been described with reference to a specific embodiment, the description is illustrative of the invention and is not to be construed as limiting the invention. Therefore, various modifications to the present invention can be made to the preferred embodiment by those skilled in the art without departing from the true spirit and scope of the invention as defined by the appended claims.

What is claimed is:

1. A socket comprising:

a base, a cover movably mounted on the base, and a driving cam rotatably received in the base and the cover;

the base having a first body portion and a first head portion extending from the first body portion along an axis thereof, a first reception space formed in the first head portion and comprising two inner stop walls spaced from each other, and at least one positioning member formed in each of the first body portion and the first head portion, wherein the at least one position member comprises two shallow regions spaced by a rib;

the cover having a second body portion and a second head portion extending from the second body portion, a second reception space formed in the second head portion, and at least one protrusion formed in each of the second body portion and the second head portion, wherein the at least one protrusion is selectively positioned in one of the two shallow regions of the at least one positioning member of the base;

the driving cam having a lower portion rotatably retained in the first reception space and rotatable between the two inner stop walls of the first reception space and an upper portion retained in the second reception space of the cover and rotatable to drive inner periphery portion of the cover thus moving the cover to move along the axis of the base;

wherein the inner stop walls of the first reception space are located at a same side with respect to the axis of the base;

wherein the driving cam defines a tool reception hole allowing an external tool to operate therewith for rotating the driving cam;

wherein the driving cam has an indication mark defined along a radial direction around the tool reception hole for indicating rotation of the driving cam;

wherein the at least one protrusion is formed in a first pair of inner walls formed in the second body portion and a second pair of inner walls formed in the second head portion and wherein the first pair of inner walls movably receives the first body portion of the base and the second pair of inner walls movably receives the first head portion of the base.

* * * * *